United States Patent [19]
Goto et al.

[11] Patent Number: 5,287,058
[45] Date of Patent: Feb. 15, 1994

[54] DIGITAL MAGNETIC FLUX MEASURING APPARATUS USING SUPERCONDUCTING QUANTUM INTERFERENCE DEVICE WITH FLUX TRAPPING PREVENTION FEATURES

[75] Inventors: Takao Goto, Kawasaki; Yutaka Igarashi, Gotenba; Takehiko Hayashi; Yoshiyasu Nakashima, both of Kawasaki, all of Japan

[73] Assignee: Fujitsu Limited, Kawasaki, Japan

[21] Appl. No.: 887,669

[22] Filed: May 26, 1992

Related U.S. Application Data

[63] Continuation of Ser. No. 655,835, Feb. 15, 1991, abandoned.

[30] Foreign Application Priority Data

Feb. 15, 1990 [JP] Japan .................................. 2-34287
Jun. 15, 1990 [JP] Japan .................................. 2-155270

[51] Int. Cl.$^5$ .................... G01R 33/02; G01R 33/035
[52] U.S. Cl. ...................................... 324/248; 505/846
[58] Field of Search ............... 324/225, 248; 505/845, 505/846

[56] References Cited

U.S. PATENT DOCUMENTS

4,851,776  7/1989  Goto et al. .

FOREIGN PATENT DOCUMENTS

0222470    8/1986  European Pat. Off. .
4010973A1  3/1990  Fed. Rep. of Germany .
WO8103710 12/1981  World Int. Prop. O. .

*Primary Examiner*—Walter E. Snow
*Attorney, Agent, or Firm*—Staas & Halsey

[57] ABSTRACT

A digital superconducting quantum interference device type fluxmeter includes a flux sensor unit which detects external magnetic flux to be measured using a SQUID ring, and outputs pulse signals of corresponding directions and numbers, and a counter unit which counts the number of pulse signals output by the flux sensor unit inclusive of the directions thereof, in order to measure the external magnetic flux based on the counted result of the counter unit. The fluxmeter further includes an offset detection unit which detects the offset quantity of the counter unit generated by the magnetic flux trapped by the SQUID ring, and a feedback unit that feeds back to the flux sensor unit a signal that is obtained based on the detected offset quantity and the counted result of the counter unit.

15 Claims, 12 Drawing Sheets

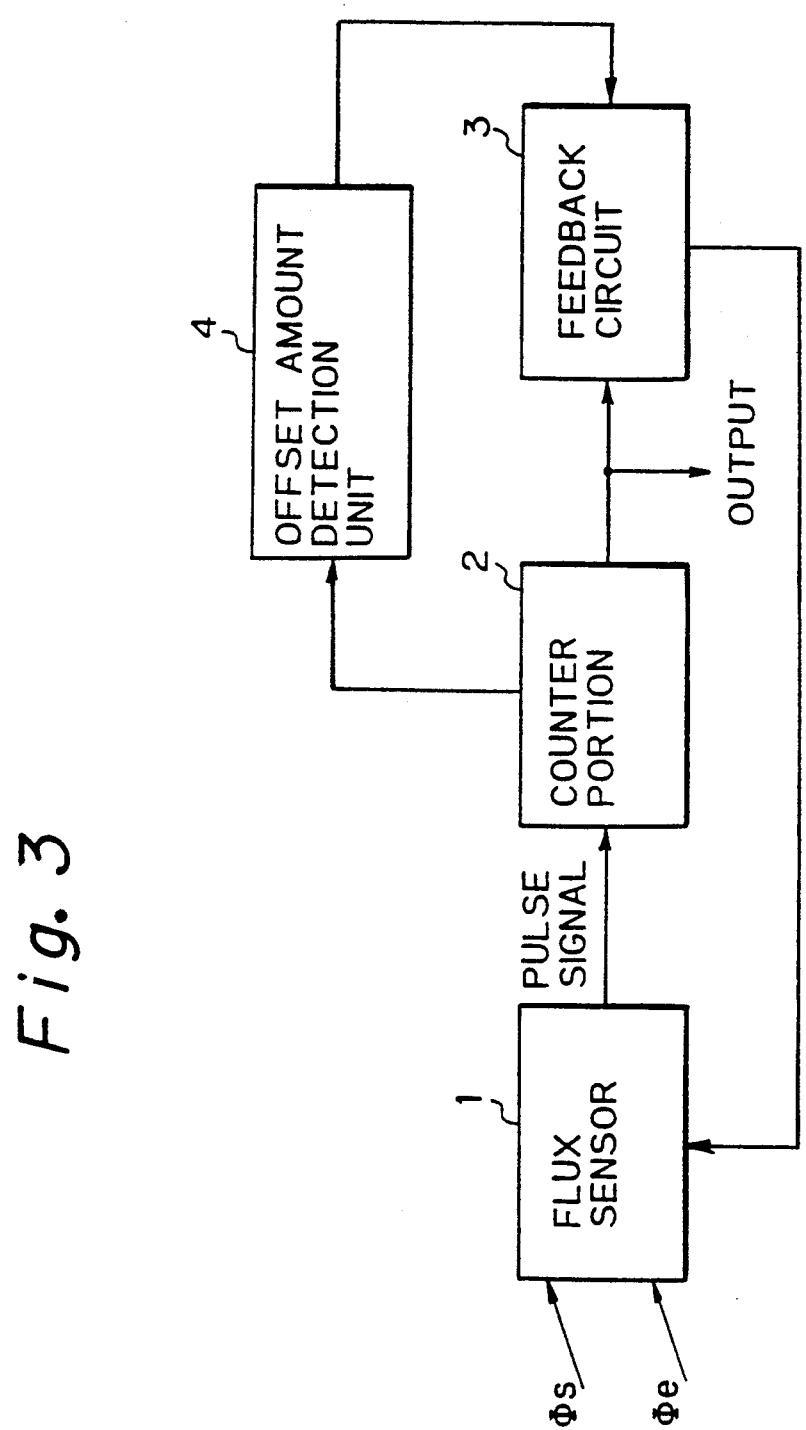

DIGITAL MAGNETIC FLUX MEASURING APPARATUS USING SUPERCONDUCTING QUANTUM INTERFERENCE DEVICE WITH FLUX TRAPPING PREVENTION FEATURES

This application is a continuation of application Ser. No. 07/655,835, filed Feb. 15, 1991, now abandoned.

BACKGROUND OF THE INVENTION

1. Field of the Invention

The present invention relates to a digital magnetic flux measuring apparatus using a superconducting quantum interference device. More particularly, it relates to a digital magnetic flux measuring apparatus using a superconducting quantum interference device (hereinafter referred to as a SQUID) for detecting external magnetic flux by using a SQUID ring to measure the number and direction of output pulse signals and t digitally process the output of the SQUID.

2. Description of the Related Art

In general, a highly sensitive fluxmeter utilizing a SQUID device has in recent years been used for the measurement of a very weak magnetic field generated from living bodies and the like. In particular, a measurement of magnetic field distribution in the brain and the heart makes it possible to estimate the source of electric current that generates the magnetic field, offering very meaningful data for diagnosis and contributing to clarifying nerve activities in the living body system. In order to measure such very weak magnetic flux, it is necessary to operate the SQUID device which is a sensor, by maintaining stability at all times. However, the superconducting SQUID device often produces a phenomenon (called flux trapping) in which the SQUID itself traps magnetic flux at a time when it shifts from the normally conducting state to the superconducting state or due to excess external noise even when it is in a superconducting state, causing the operation of the SQUID to become unstable. In a multi-channel SQUID fluxmeter in which a plurality of SQUID sensors are arranged to measure a magnetic field distribution at one time, it is very important that the individual SQUIDs operate stably, and a digital SQUID fluxmeter is necessary to compensate for the effect of flux trapping.

The fundamental operation of the above digital SQUID fluxmeter has been mentioned in, for example, N. Fujimaki et al., "A Single-Chip SQUID Magnetometer", IEEE Trans. Electron Device, Vol. 35, No. 12, 1968, pp. 2412-2418. This literature also refers to a single-chip SQUID in which the counter unit and the feedback unit consist of superconducting circuitry.

As a matter of fact, however, since the magnetic flux trapped by the SQUID ring is compensated, the counter generates a corresponding offset quantity and thereby the counting range or the dynamic range of the counter is narrowed. Moreover, since the magnetic flux is trapped, it becomes difficult to correctly measure the external magnetic flux.

The object of the present invention therefore is to provide a digital SQUID fluxmeter which is newly equipped with a circuit that cancels the quantity which is produced by the counter and which is equal to the compensation of flux trapping, maintaining a maximum dynamic range, improved reliability, and stability at all times.

Another conventional SQUID fluxmeter picks up magnetic flux by using a pickup coil and transfers it to the SQUID via a flux transformer.

Examples of this kind of digital SQUID include a SQUID consisting of a two-junction quantum interference element which operates on AC bias to produce pulses (see Japanese Unexamined Patent Publication (Kokai) No. 63-29979) and a DC SQUID which operates in an analog manner and in which the voltage thereof is applied to a superconducting converter or to a one-bit A/D converter to obtain pulse outputs ( Drung, Cryogenics, Vol. 26, pp. 623-627, 1986).

Therefore, the feedback circuit is provided with an offset voltage control circuit that detects the trapped amount counted by the up-down counter and an offset voltage generator that applies an offset voltage to the feedback circuit in response to a signal from the offset voltage control circuit, in order to always compensate the offset amount caused by the flux trapping using the offset voltage control circuit and thereby to prevent the dynamic range from decreasing.

According to the above prior art, however, when the amount of magnetic flux to be fed back per pulse is decreased in an attempt to decrease the effect of quantization noise and to improve the sensitivity of the fluxmeter, it becomes no longer possible to compensate the trapped magnetic flux $\Phi_t$ despite the feedback current being fed from the D/A converter to the feedback circuit at the full-range. After the power source circuit is closed, therefore, the feedback operation is not carried out and the fluxmeter fails to work.

SUMMARY OF THE INVENTION

It is an object of the present invention to provide a digital SQUID type fluxmeter using a superconducting quantum interference device that maintains a maximum dynamic range at all times and operates stably.

According to the fundamental aspect of the present invention, there is provided a digital SQUID type magnetic flux measuring apparatus using a superconducting quantum interference element, the apparatus including a flux sensor unit which detects external magnetic flux to be measured using a SQUID ring and outputs pulse signals of corresponding directions and numbers, and a counter unit which counts the number of pulse signals output by the flux sensor unit inclusive of the directions thereof, in order to measure the external magnetic flux based on the counted result of the counter unit, wherein an offset quantity detection unit detects the offset quantity of the counter unit generated by the magnetic flux trapped by the SQUID ring, and a feedback unit feeds back to the flux sensor unit a signal that is obtained based on the detected offset quantity and the counted result of the counter unit.

According to another aspect of the present invention, there is provided a digital SQUID type magnetic flux measuring apparatus using a superconducting quantum interference element, the apparatus including a magnetic flux sensor which has a superconducting quantum interference element, an AC current source that applies an AC bias to the superconducting quantum interference element, and a feedback circuit that feeds an amount of magnetic flux proportional to the number of output pulses from the superconducting quantum interference element back to the superconducting quantum interference element, wherein the feedback circuit is connected a trap compensation circuit that detects the offset amount generated by the trapped magnetic flux detected by supplying a feedback current which is at least greater than an ordinary value, and the fluxmeter using the superconducting quantum interference element is operated while supplying the offset current to the feedback coil.

BRIEF DESCRIPTION OF THE DRAWINGS

FIG. 3 is a block diagram illustrating the principle of the present invention;

DESCRIPTION OF THE PREFERRED EMBODIMENT

With reference to the prior art drawings, the present invention will be described in detail by clarifying the differences between the present invention and the prior art.

Figure 1:
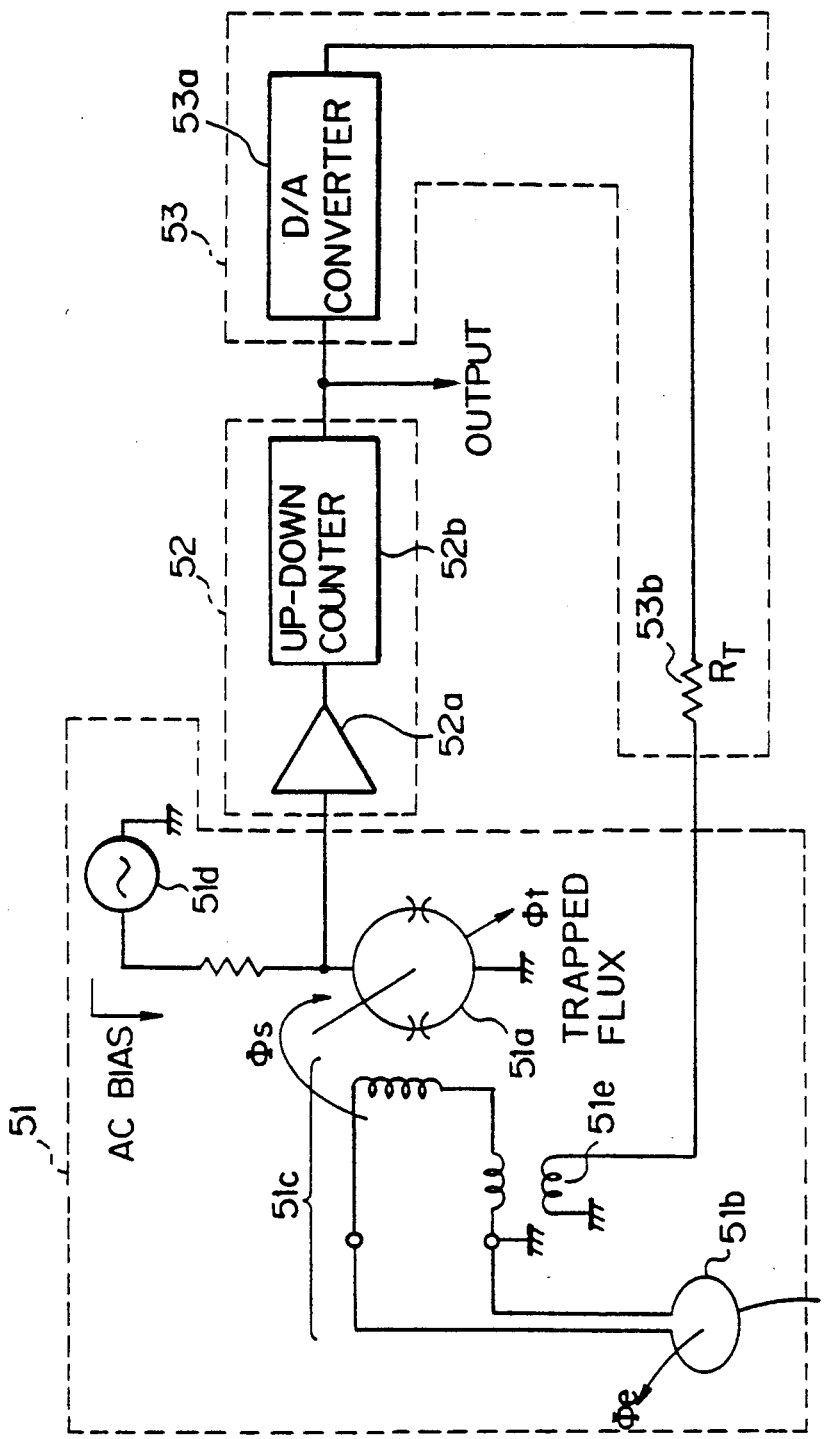
FIG. 1 is a prior art circuit diagram of SQUID fluxmeter.

A prior art digital SQUID fluxmeter, as shown in FIG. 1, comprises a flux sensor unit 51 having a SQUID ring 51a that utilizes the Josephson effect, a pickup coil 51b that detects the external magnetic flux, a flux transformer 51c that transfers an external magnetic field to the SQUID ring 51a effectively, an AC oscillator 51d that applies an AC bias to output pulse signals, and a feedback coil 51e; a counter unit 52 having a preamplifier 52a for amplifying pulse outputs maintaining a good S/N ratio, and an up-down counter 52b that counts the pulse outputs to output a digital value; and a feedback unit 53 having a D/A converter 53a that converts the output of the counter 52b into an analog quantity of a corresponding level, and a feedback resistor 53b that converts said analog quantity into an electric current.

The constitution and operation of the flux sensor are the same as those of the present invention. Operation of the digital SQUID fluxmeter according to the prior art will now be briefly described in conjunction with FIGS. 1 and 2.

Figure 2A:
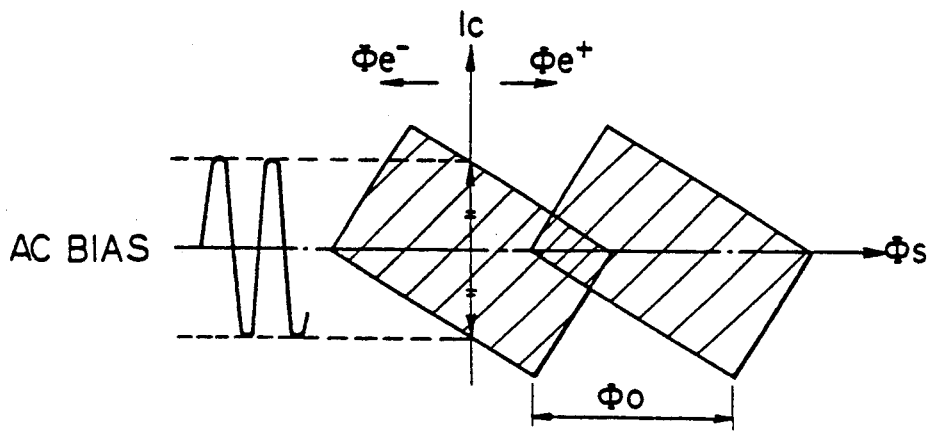
FIGS. 2(a) -2(c) are diagrams showing the operation of the digital SQUID ring according to FIG. 1.
Figure 2B:
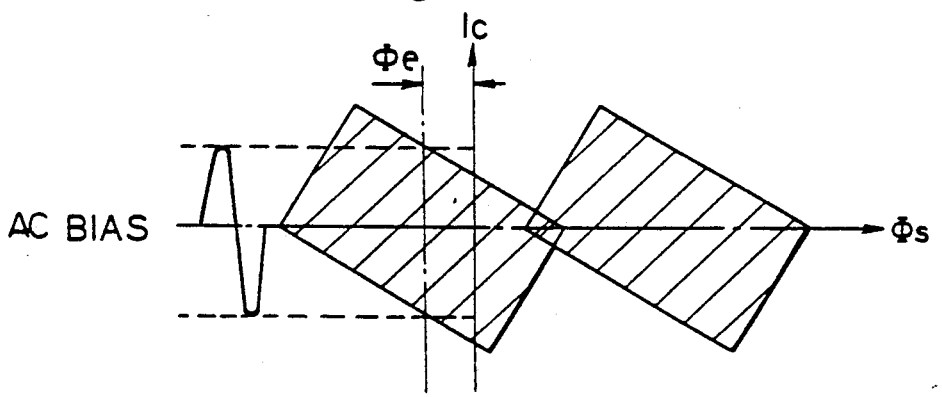

Under the condition where the flux trapping ($\Phi_t$) is not taking place, there exists a relationship between the magnetic flux ($\Phi_s$) interlinking the SQUID ring 51a and the critical current (Ic) of the SQUID ring 51a as shown in FIG. 2(a). Under the condition $\Phi_s=0$, in particular, the absolute value of positive Ic is equal to that of negative Ic. It is seen in FIG. 2(a) that hatched areas represent superconducting condition. When a current value exists in these areas, the voltage is zero and when a current value lies outside these areas, the voltage assumes a finite value.

Here, the AC oscillator 51d applies an AC bias that is equal to Ic. The positive external magnetic flux ($\Phi_e^+$) that is applied to the pickup coil 51b under this condition, is transferred to the SQUID ring 51a via the flux transformer 51c, whereby the Ic-axis undergoes parallel translation toward the right side from the relationship of FIG. 2(a). Therefore, Ic of the positive side crossed by the above axis becomes small, and the SQUID ring 51a is shifted to a voltage condition in a positive half period of the AC bias to output positive pulses. Similarly, when the negative flux ($\Phi_e^-$) is applied, the Ic-axis undergoes parallel translation toward the negative side, whereby the absolute value of Ic on the negative side becomes small and negative pulses are produced.

Pulses output from the flux sensor unit 51 are counted by said up-down counter 52b, and are converted into analog quantities through said D/A converter 53a.

If the analog quantities are magnetically coupled to the SQUID ring 51a via the feedback resistor 53b and feedback coil 51e, and if the magnetic flux applied to the SQUID ring 51a is so controlled as to become constant (or zero) at all times, then the feedback quantity varies in proportion to the external magnetic flux.

Figure 2C:
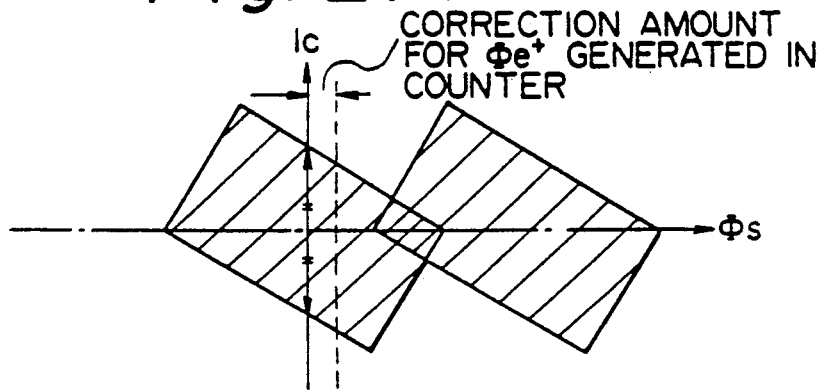

Next, in case where flux trapping has taken place, the relationship $\Phi$ − Ic becomes as shown in FIG. 2(c); i.e., the characteristics are laterally shifted by the amount of flux trapping ($\Phi_t$) compared with FIG. 2(a).

When no flux is input to the pickup coil 51b, the feedback that is applied works to compensate by the amount of flux trapping, and the relationship $\Phi_s$−Ic finally becomes as shown in FIG. 2(a). Here, however, the amount $\Phi_t$ that is compensated has been generated by the up-down counter 52b.

As a matter of fact, however, since the magnetic flux trapped by the SQUID ring is compensated, the counter generates the corresponding offset quantity and thereby the counting range or the dynamic range of the counter is narrowed. Moreover, since the magnetic flux is trapped, it becomes difficult to correctly measure the absolute value of external magnetic flux.

FIG. 3 is a block diagram illustrating the principle of the present invention. The digital SQUID fluxmeter of the present invention operates as described below.

The external magnetic flux $\Phi e$ detected by the flux sensor unit 1 is output by the SQUID ring and the like as pulses inclusive of directions, which are then counted by the counter unit (or "counter portion") 2.

Here, as explained before, SQUID stands for a superconducting quantum interference device which is a highly sensitive flux sensor having one or more Josephson junctions in a ring that is made of a superconducting material. For example, there is known a DC-type device that has two junctions in a superconducting ring and that operates on a DC bias current and a device.

The digital SQUID ring used in the present invention assumes two conditions, i.e., a zero-voltage condition and a definite voltage condition, depending upon the critical conditions determined by the magnetic flux and electric current, and produces a pulse signal when the combination thereof establishes a definite voltage condition.

The counter unit 2 counts to add the number of pulse signals when they have a positive direction and counts to subtract the number of pulse signals when they have a negative direction.

When the flux trapping phenomenon is taking place in which the magnetic flux is trapped, the SQUID ring continues to produce the pulse signals even in the condition $\Phi_e$ exists.

The number of pulse signals counted by the counter unit 2 is converted into a corresponding signal to be output and it is seen that the external magnetic flux is measured based on these signals.

At this moment, the offset quantity detection unit (or "offset amount detection unit") 4 detects the offset quantity based on the number of pulse signals counted by the counter unit 2.

The counted result of the counter unit 2 and the offset quantity detected by the offset quantity detection unit or ("feedback circuit") 4 are input to the feedback unit 3 which feeds a signal obtained based on these quantities back to the magnetic flux sensor unit 1. The offset quantity detection unit 4 can include a digital low pass filter and an offset voltage generator, for example, similar to those described with reference to FIG. 6.

In this case, the signal obtained based on these quantities is one that removes the external magnetic flux and the offset quantity. Here, only the external magnetic flux from which the flux trap quantity is removed, is measured and thereby an output is obtained which corresponds to the external magnetic flux that is not affected by the flux trapping.

Figure 4:
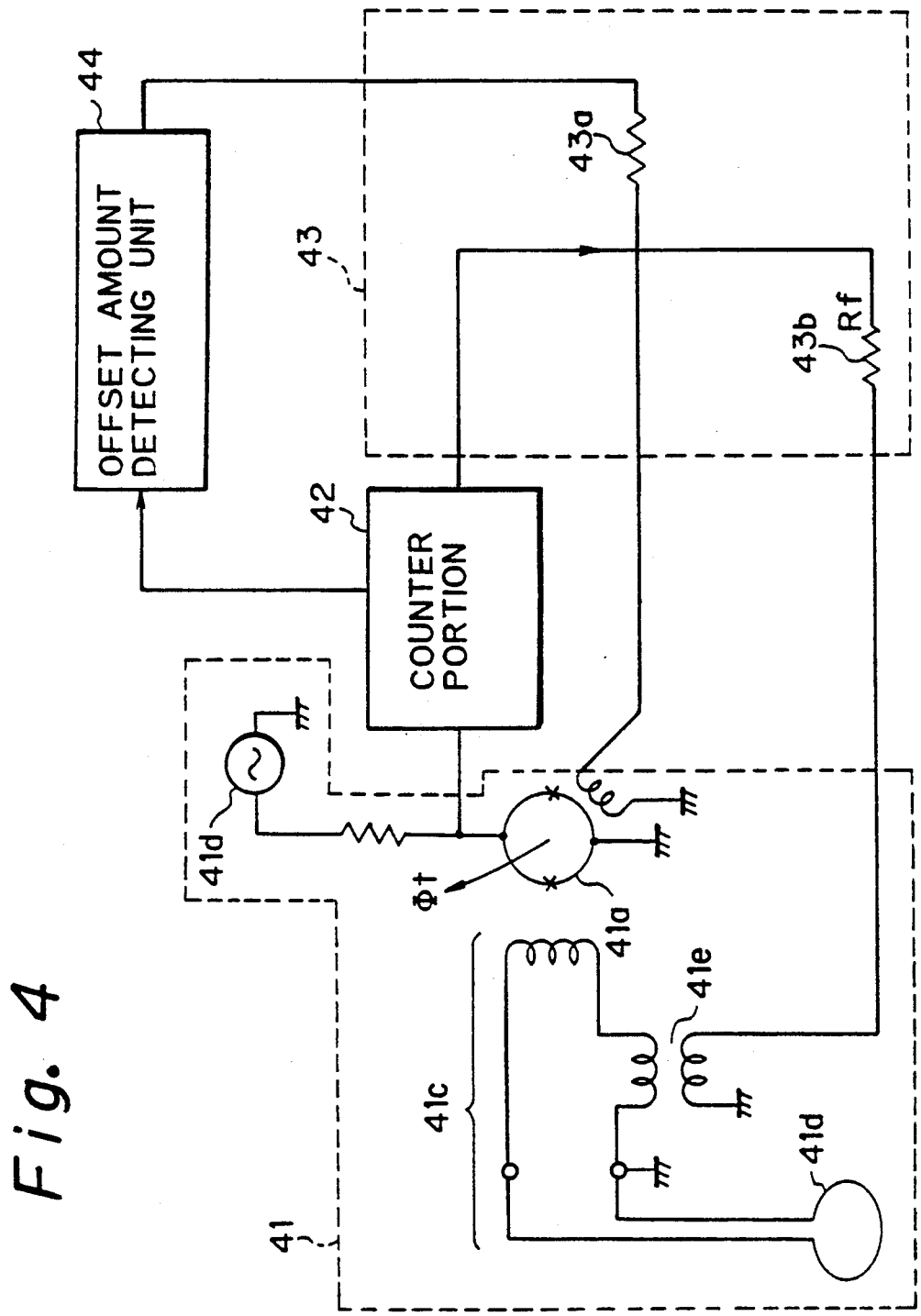
FIG. 4 is a block diagram illustrating an embodiment of the present invention.
Figure 5:
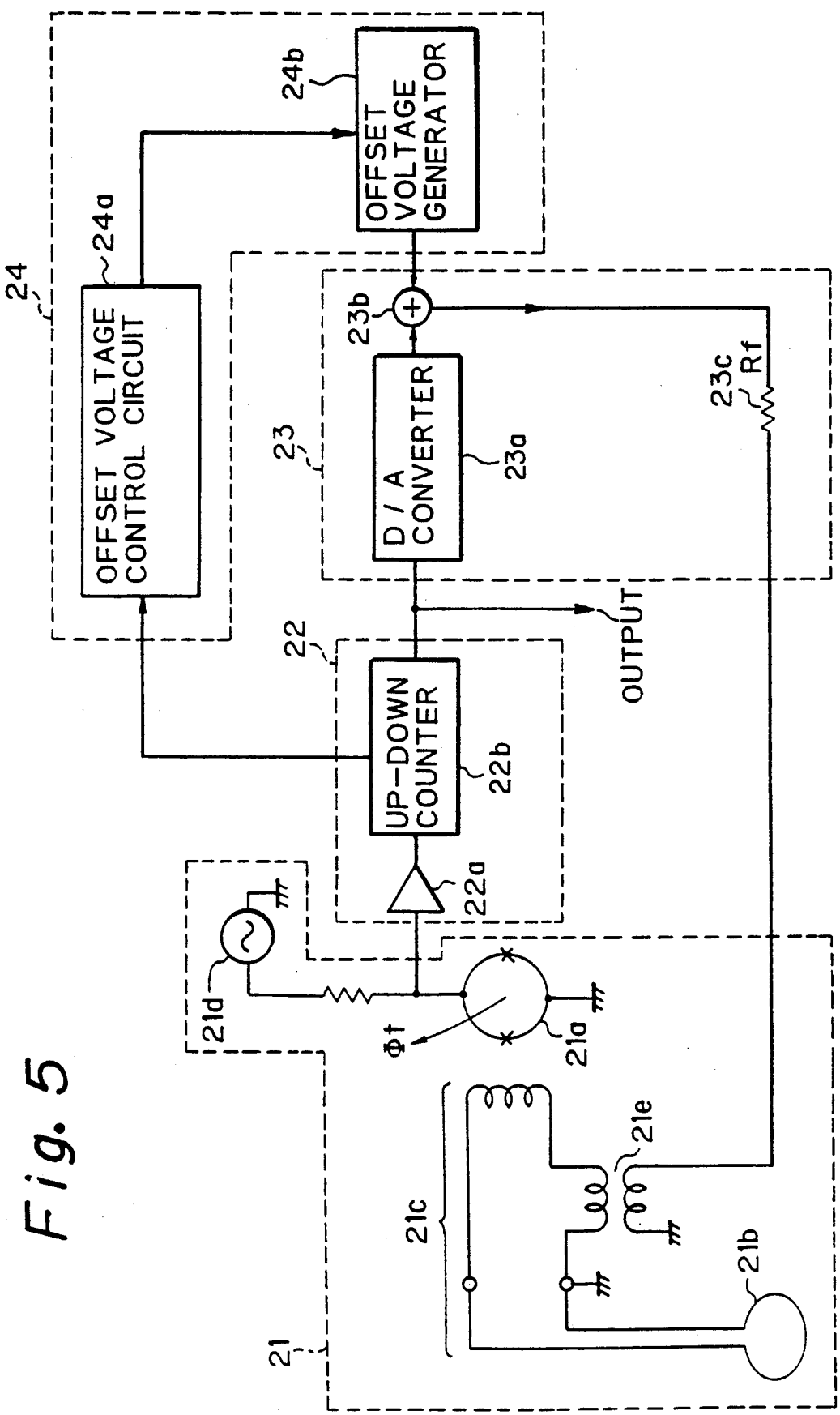
FIG. 5 is a block diagram illustrating another embodiment of the present invention.

FIG. 4 is a block diagram illustrating an embodiment of the present invention and FIG. 5 is a block diagram illustrating another embodiment of the present invention, both figures being based on the same principle of FIG. 3.

Both the devices of FIG. 4 and FIG. 5 operate according to the principle of FIG. 3.

Regarding the SQUID device of FIG. 4, the feedback unit 43 separately feeds back to the flux sensor unit 41 a signal obtained based on the detected offset quantity and a signal based on the counted result of said counter unit 42. The offset quantity detection unit 44 can include a digital low pass filter and an offset voltage generator, for example, similar to those described with reference to FIG. 6.

Further, regarding the SQUID device of FIG. 5, the digital SQUID flux meter includes a flux sensor unit 21 having a SQUID ring 21a utilizing the Josephson effect, a pickup coil 21b for detecting external magnetic flux, a flux transformer 21c for transferring the effect of an external magnetic field and the like detected by the SQUID ring 21a, an AC oscillator 21d outputting pulse signals, and a feedback coil 21e.

The SQUID device includes a counter unit 22 connected to the flux sensor unit 21. The counter unit 22 has a preamplifier 22a for amplifying pulse outputs while maintaining a good S/N ratio and an up-down counter 22b for counting the pulse outputs.

The SQUID device further includes an offset quantity detection unit 24 having an offset voltage control circuit 24a for outputting a signal that corresponds to an offset quantity obtained based on the counted value of the up-down counter 22b, and an offset voltage generator 24b that converts the signal into a signal of a corresponding voltage level. For example, the offset voltage control circuit 24a can be implemented as a digital low pass filter and the offset voltage generator 24b can be implemented in a variety of ways (e.g., as a D/A converter) which will readily occur to those of ordinary skill in the art.

The SQUID still further includes a feedback unit 23 which is connected to a counter unit 22 and an offset voltage generator 24b included within the offset quantity detection unit 24. The feedback unit 23 has a D/A converter 23a that converts the output of the counter unit 22 into an analog quantity of a corresponding level, and has a feedback resistor 23c that converts the analog quantity into an electric current.

Embodiments of the present invention will now be described in detail.

Figure 6:
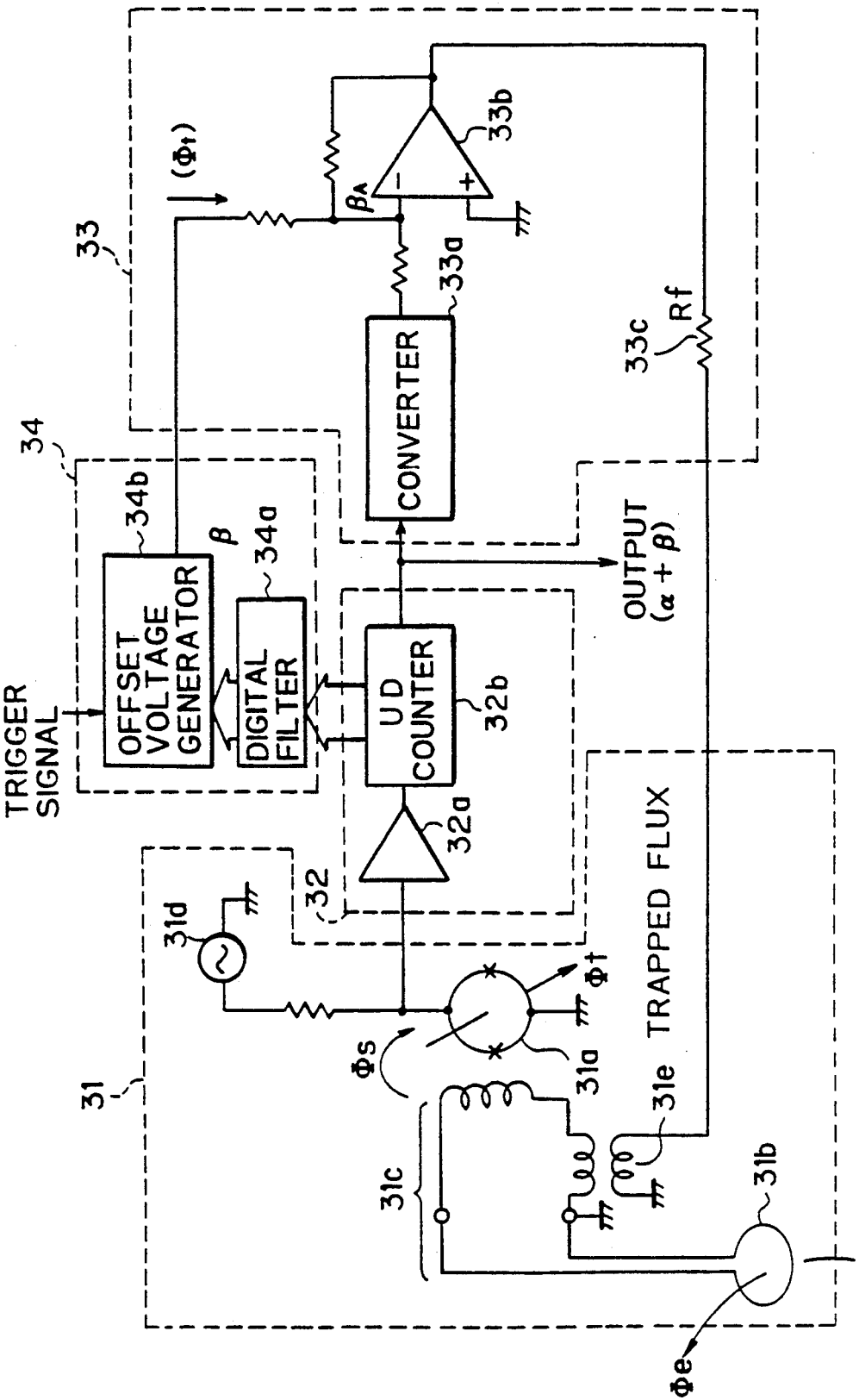
FIG. 6 is a block diagram illustrating still another embodiment of the present invention.

Referring to FIG. 6, the device of the invention comprises a flux sensor unit 31 having a SQUID ring 31a that utilizes the Josephson effect, a pickup coil 31b that detects external magnetic flux $\Phi_e$, a flux transformer 31c that transfers the effect of an external magnetic field and the like detected by the SQUID ring 31a, an AC oscillator 31d for outputting pulse signals, and a feedback coil 31e. The device also comprises a counter unit 32 having a pre-amplifier 32a that amplifies the pulse output while maintaining a good S/N ratio, and an up-down counter 32b that counts the pulse outputs inclusive of directions thereof to output a digital value. Further, the device comprises an offset quantity detection unit 34 having a digital low pass filter 34a that works as the aforementioned offset voltage control circuit 34 and since the cutoff frequency is less than 1 Hertz, for example, the d.c. component can easily be detected using a well-known finite impulse response (FIR) filter. which obtains a DC component corresponding to the offset quantity by removing, by calculation, the components greater than a predetermined frequency, based on the counted value of the up-down counter 32b, and an offset voltage generator 34b that outputs an analog signal of a level corresponding to the offset quantity. In addition, the device comprises a feedback unit 33 having a D/A converter 33a that converts the digital value output from the counter 32 into an analog quantity of a corresponding level, an adder 33b that adds to said analog quantity an analog quantity output from the offset voltage generator 34b, and a feedback resistor 33c that converts the added analog quantity into a current.

This device operates as described below.

In the beginning of a measurement, when the offset voltage generator 34b is not in operation, a feedback operation is effected to compensate the trapped flux $\Phi_t$ and the external magnetic flux $\Phi_e$ and the counter outputs $(\Phi_t+\Phi_e)$ (generally, $\Phi_t>>\Phi_e$). Then, when the offset voltage generator 34b is operated by a compensation trigger signal and the digital filter 34a is made to pass only a D.C. component, the output of the digital filter 34a is $(\Phi_t+\Phi_e(DC))$, thus the voltage value equivalent to the output is produced by the offset voltage generator 34b. The adder 33b adds each output voltage of the offset voltage generator 34b and the D-A convertor 33a to feedback the resulting signal to the flux sensor unit 31. Therefore, the amount of $\Phi_t$ is cancelled to only output $\Phi_e(AC)$.

When a relatively steady flux ($\beta$) is trapped by the SQUID ring 31a in addition to the external magnetic flux ($\alpha$), the SQUID ring 31a produced pulse signals of a number corresponding to $(\alpha)+(\beta)$, and the up-down counter (or "4D counter") 32b produces a counted value to which an offset quantity if added, i.e., $\alpha+\beta$.

In this case, the digital filter 34a in the offset quantity detection unit 34 permits the passage of the offset quantity $\beta$ that corresponds to the steady amount of flux that is trapped, and the offset voltage generator 34b produces an analog signal of a voltage of a level corresponding to the offset quantity $\beta$ through D/A conversion.

Here, the value $\alpha+\beta$ measured by the up-down counter 32b is converted into an analog quantity through the D/A converter 33a, and is input to the adder 33b. On the other hand, an analog quantity corresponding to the offset quantity $\beta$ output from the offset quantity detection unit 34, too, is input to the adder 33b in the feedback unit 33.

The code of the analog quantity corresponding to the added quantity $\alpha+2\alpha$ (or which may be subtracted depending upon the polarity of the trapped magnetic flux) is inverted, and is input to the feedback coil 31e in the flux sensor 31. At this moment, if it is considered that the quantity is fed back before the external magnetic field $\Phi_3$ changes, then a magnetic flux $-\beta$ is input to the subtraction SQUID ring at a moment when $\alpha+2\beta$ is fed back, and then the counter unit 32 counts down the pulses to cancel the quantity by the above quantity, and hence the counted value becomes $\alpha$. Next, even when the input signal $\alpha$ changes into $\alpha'$, the amount trapped is not counted by the counter unit and the counted value changes into $\alpha'$ since the magnetic flux for compensating the trapped amount has been added by the offset voltage generator.

According to this embodiment as described above, it is made possible to effectively utilize a finite dynamic range (e.g., 16 bits) of the up-down counter 22b which performs the counting while removing offset.

In this case, the DC component in the input magnetic flux is compensated at the same time and is not observed, though the DC flux is seldom observed in medical applications, especially to localize the current sources in the brain and heart. In case it is required to observe the DC magnetic flux, however, the condition may be established in which no flux enters into the pickup coil 31b (e.g., covered with a magnetic shielding member) prior to starting a measurement, and the control operation is effected only one time as the initialization to compensate the amount of the magnetic flux trapped by the SQUID.

According to the present invention as described above, the offset quantity detection unit is provided to detect the offset caused by the trapping of magnetic flux based on the value counted by the counter unit, and the counted value counted by the counter unit to which the offset quantity is added, is fed back to the flux sensor in order to remove the offset quantity caused by the trapping of magnetic flux.

According to the present invention, therefore, the countable range of the counting unit is not narrowed, i.e., the dynamic range is not narrowed by the offset quantity, but is maintained at the greatest range. However, the external magnetic flux from which the flux trapping is removed can be measured correctly and stably. It is therefore possible to provide a digital SQUID fluxmeter having good performance and reliability.

In particular, it can be realized that the present invention contributes to improving performance of the device when it is realized in a multi-channel form.

Next, problems of a multi-channel SQUID fluxmeter will be discussed with reference to FIGS. 7 to 12.

In a multi-channel SQUID fluxmeter in which a plurality of SQUID sensors are arranged to measure the magnetic field distribution at one time, it is very important that the individual SQUIDs operate stably, and it has been desired to provide a SQUID fluxmeter which is capable of compensating the effect of the flux trapping.

Figure 7:
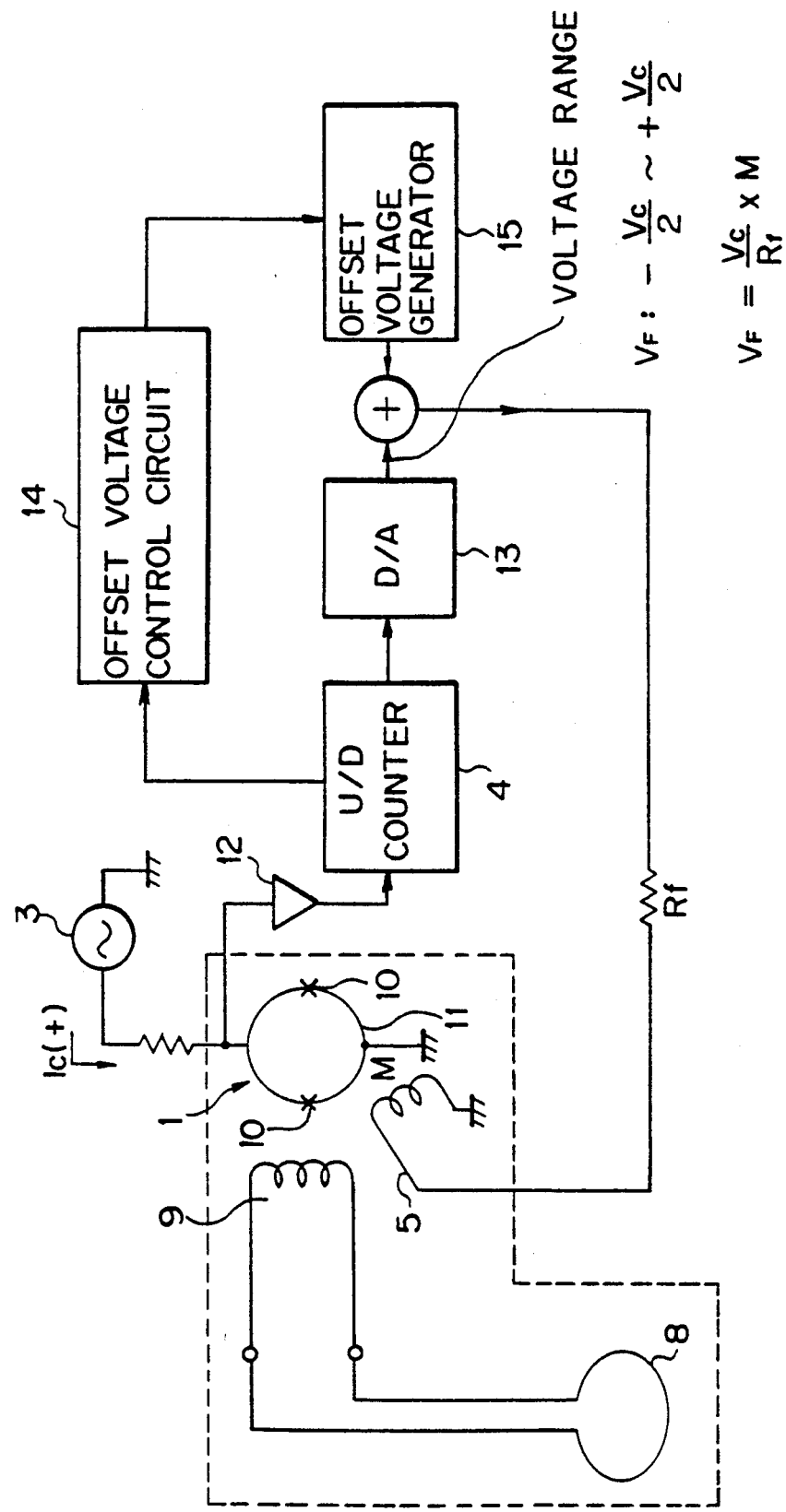
FIG. 7 is a circuit diagram showing another embodiment of the present invention.

FIG. 7 shows a SQUID fluxmeter which is so constituted that the magnetic flux picked up by a pickup coil 8 is transferred to the SQUID 1 via a flux transformer 9.

Figure 8A:
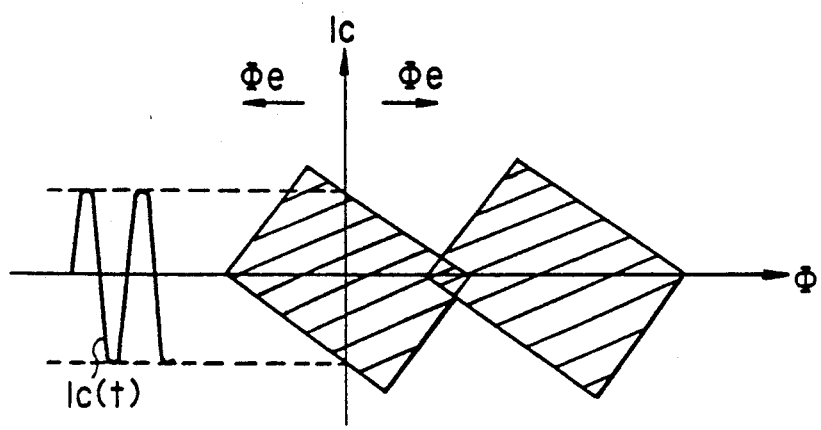
FIGS. 8(a)-8(c) are diagrams showing a magnetic flux $\Phi$ vs. a critical current Ic characteristic curve.

The SQUID 1 consists of two or more Josephson junctions 10, 10 and a superconducting loop 11, and is magnetically coupled to the flux transformer 9. As shown in FIG. 8(a), the SQUID 1 transfers between the no-voltage condition represented by the hatched areas and the voltage condition on the outside areas thereof depending upon a change in the amount of magnetic flux $\Phi$ that is coupled to the SQUID 1 and the bias current Ic, and is so designed as to undergo the shift on the same bias current of positive and negative signs when the amount of magnetic flux $\Phi$ coupled to the SQUID 1 is zero. The thus constituted SQUID 1 is supplied with a bias current Ic(t) from the AC current source 3, the bias current Ic(t) having a maximum value which is equal to a critical current. The external magnetic flux $\Phi_e+$ that is applied to the pickup coil 8 under this condition, is transferred to the SQUID 1 via the transformer 9, and the critical current decreases on the $+$ side. Therefore, the SQUID 1 is shifted to the voltage condition in a positive half period of the bias Ic(t) and produces a positive pulse. Similarly, when a negative magnetic flux is applied, the SQUID 1 produces a negative pulse. The pulse that is output is amplified through a pre-amplifier 12, counted by an up-down counter 4, converted into an analog signal through a D/A converter 13, and a feedback magnetic flux is produced by a feedback coil 5 to cancel the magnetic flux applied to the SQUID via a feedback coil 5. The pulses are counted by the up-down counter 4 until the magnetic flux applied to the SQUID 1 becomes constant or zero, i.e., until no pulse is output from the SQUID 1. The magnetic flux $\Phi_e$ interlinking the pickup coil 8 is found based upon the number of counts.

Figure 8B:
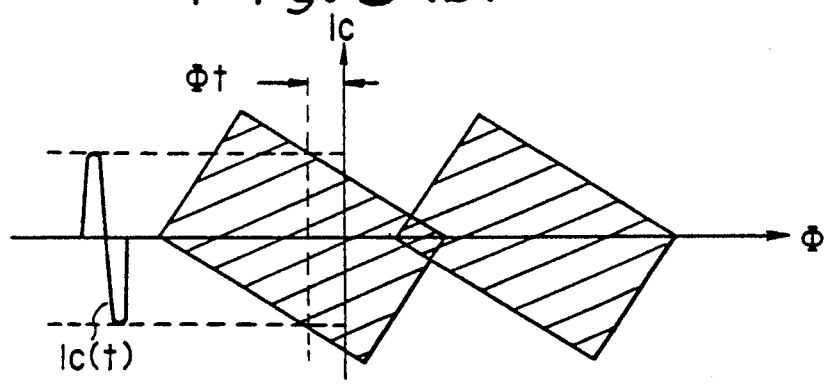
Figure 8C:
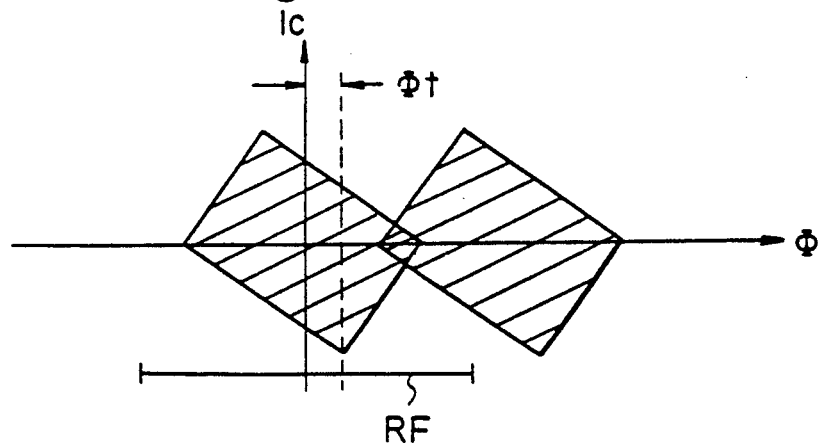

When the flux trapping has taken place, on the other hand, the magnetic flux $\Phi_t$ that is trapped is given to the SQUID 1 under the initial condition, and the $\Phi$-Ic characteristics are laterally shifted by the amount of magnetic flux $\Phi_t$ that is trapped as shown in FIG. 8(b). The feedback that is applied under this condition works to compensate the magnetic flux by the amount that is trapped in the case where the magnetic flux $\Phi_e$ is not input to the pickup coil 8. Therefore, the $\Phi$-Ic characteristics become as shown in FIG. 8(c). Here, the amount $\Phi_t$ compensated is generated by the up-down counter 4, while the full-range RF of the D/A converter 13 is shifted and the dynamic range decreases for the external magnetic flux $\Phi_e$ that is to be detected.

Therefore, the feedback circuit is provided with an offset voltage control circuit 14 that detects the trapped amount counted by the up-down counter 4 and an offset voltage generator 15 that applies an offset voltage to the feedback circuit in response to a signal from the offset voltage control circuit 14, in order to continually compensate the offset amount caused by the flux trapping using the offset voltage control circuit 14 thereby to prevent the dynamic range from decreasing.

Figure 9:
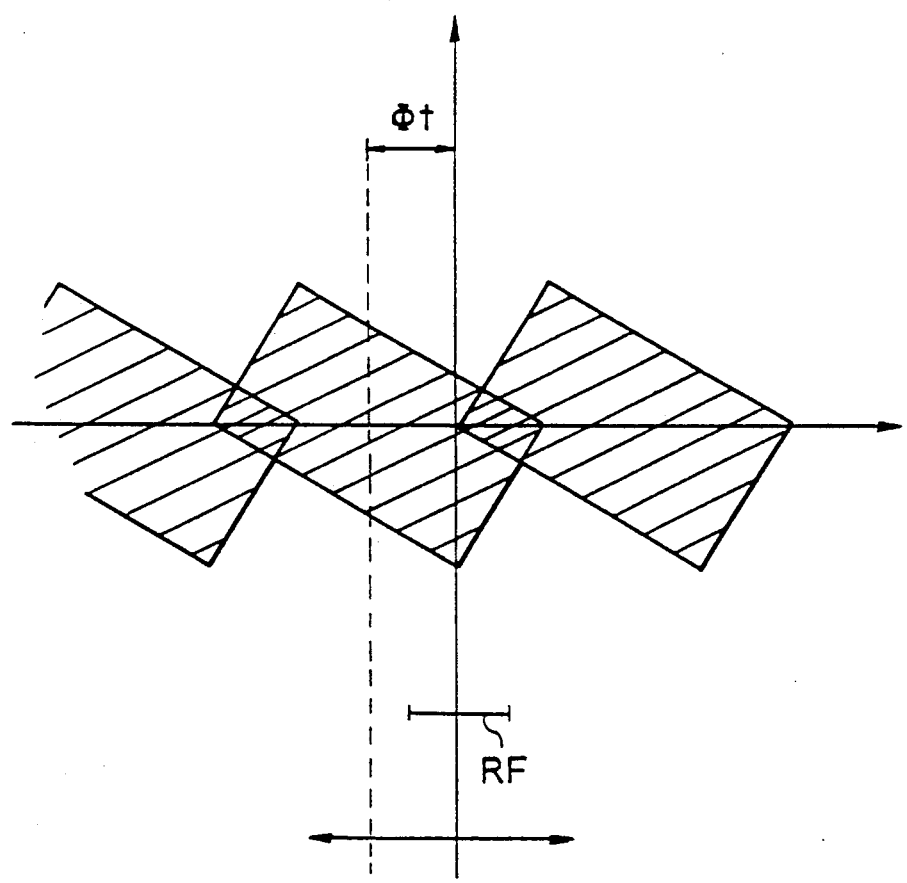
FIG. 9 is a diagram showing an offset condition caused by the trapped magnetic flux.

FIG. 9 is a diagram showing an offset state due to trapped fluxes. In FIG. 9, RF denotes an area of fluxes in which a fluxmeter can measure, and $\Phi_t$ denotes trapped fluxes which surpass the area for which measurement is possible.

In the above embodiment, however, when the amount of magnetic flux to be fed back per pulse is decreased in an attempt to decrease the effect of quantization noise and to improve the sensitivity of the fluxmeter, it becomes no longer possible to compensate the trapped magnetic flux $\Phi_t$ despite the feedback current being fed from the D/A converter 13 to the feedback circuit at the full-range RF as shown in FIG. 7. After the power source circuit is closed, therefore, the feedback operation is not carried out and the fluxmeter fails to work.

Figure 10:
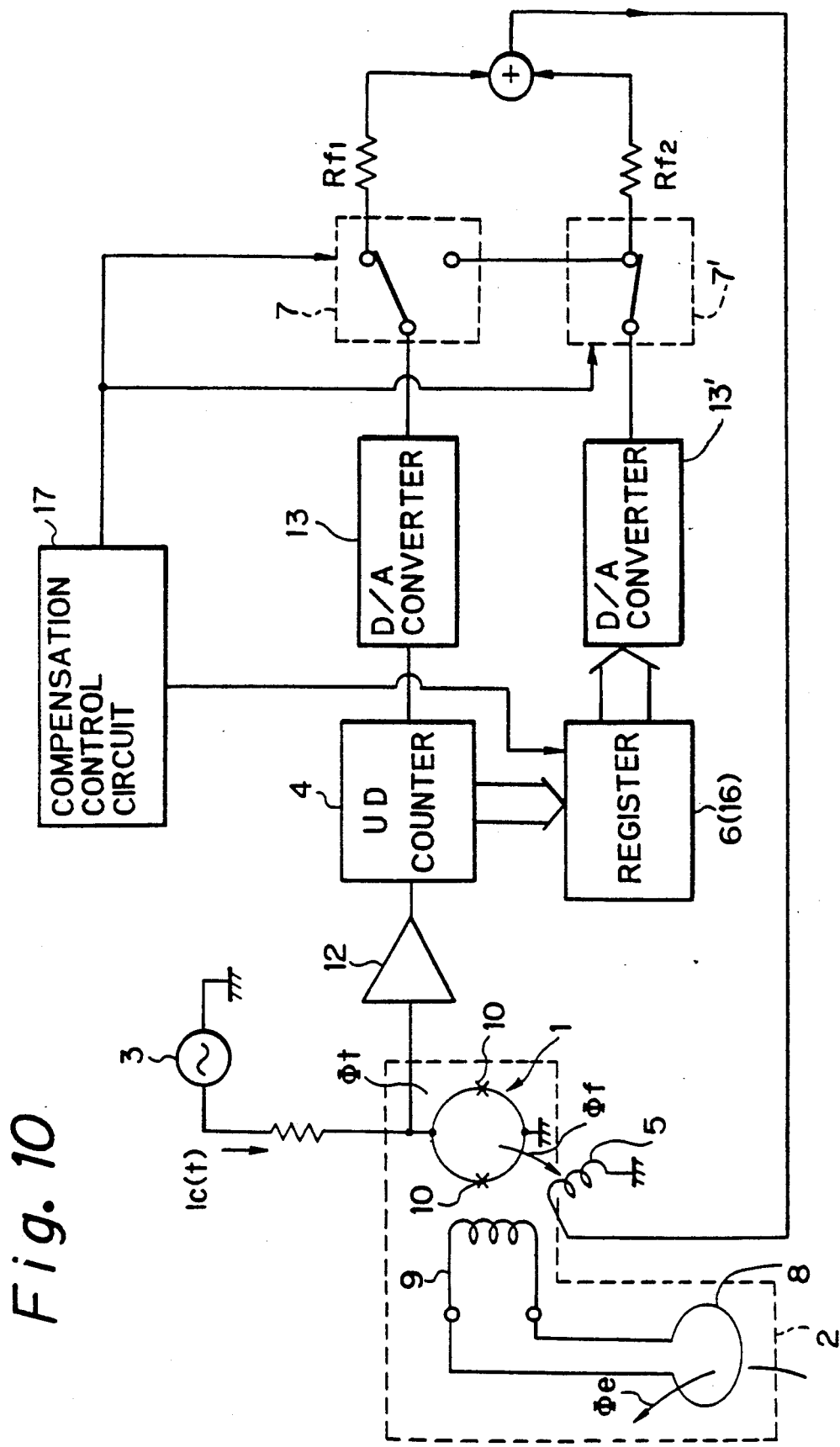
FIG. 10 is a circuit diagram of an embodiment according to a multi-channel type SQUID fluxmeter.

According to another embodiment of the present invention as shown in FIG. 10, there is provided a digital SQUID fluxmeter for measuring external magnetic flux comprising a magnetic flux sensor 2 which has a superconducting quantum interference element 1, an AC current source 3 that applies an AC bias to the superconducting quantum interference element 1, and a feedback circuit that feeds an amount of magnetic flux proportional to the number of output pulses from the superconducting quantum interference element 1 back to the superconducting quantum interference element 1. The fluxmeter using a superconducting quantum interference element includes a trap compensation circuit 6 connected to the feedback circuit. The trap compensation circuit 6 detects the offset amount generated by the trapped magnetic flux $\Phi_t$ detected by supplying a feedback current which is at least greater than an ordinary value. The fluxmeter using the superconducting quantum interference element is operated while supplying the offset current to the feedback coil 5.

Furthermore, the feedback circuit may be provided with a plurality of feedback resistors $R_{f1}$, $R_{f2}$, —having dissimilar resistances, and the feedback resistors $R_{f1}$, $R_{f2}$, —are selected by switches 7, 7' to set a feedback current at the time when the trapped magnetic flux $\Phi_t$ is detected and measured.

Moreover, the feedback resistor $R_{f1}$ in the feedback circuit consists of a variable resistor, and the resistance of the variable resistor is changed by the switch 7 in order to set the feedback current at the time when the trapped magnetic flux $\Phi_t$ is detected and measured.

Further, the full range of the feedback circuit is made variable and is varied in order to set the feedback current at the time when the trapped magnetic flux $\Phi_t$ is detected and measured.

It is further possible to provide one or a plurality of feedback coils connected to the trap compensation circuit 6 that detects the offset amount generated by the trapped magnetic flux $\Phi_t$ detected by supplying a feedback current which is at least greater than an ordinary value, and to provide feedback coils 5 that are connected to the feedback circuit.

According to the present invention constituted as described above, the trapped flux $\Phi_t$ is detected by supplying a large feedback current to the feedback coil 5. Owing to the feedback operation using a large feedback current, it is possible to supply to the SQUID 1 a feedback magnetic flux $\Phi_f$ which is large enough to cancel the trapped magnetic flux $\Phi_t$; i.e., the trapped magnetic flux $\Phi_t$ is reliably detected avoiding an inoperative condition. The offset amount caused by the trapped flux $\Phi_t$ detected above is added to the feedback coil 5 thereby to measure the external magnetic flux. Therefore, the trapped magnetic flux $\Phi_t$ is reliably compensated, and the compensation method that separately supplies the offset current prevents the dynamic range from decreasing.

According to still another embodiment, the offset current is selected by selecting the feedback resistor $R_{f1}$, $R_{f2}$, —, and according to a further embodiment of the invention, the feedback resistor $R_{f1}$ is made variable, and the full-range of the feedback circuit is changed in order to compensate the offset current, and furthermore, the magnetic flux $\Phi_f$ fed back to the SQUID 1 is changed by selecting a plurality of feedback coils 5.

FIG. 10 shows an embodiment of the present invention, wherein reference numeral 1 denotes a SQUID having two Josephson junctions 10, 10 connected in series, which has applied thereto a magnetic flux $\Phi_e$ trapped by a pickup coil 8 via a flux transfer transformer 9. The SQUID 1 further has applied thereto an AC bias current Ic(t) from an AC current source 3, and produces a pulse voltage in compliance with the $\Phi$-Ic characteristics shown in FIG. 8(a). The pulse voltage that is produced is amplified through a pre-amplifier 12, and is counted by an up-down counter (or "4D counter") 4. A D/A converter 13 converts the output from the up-down counter 4 into an analog quantity which is then supplied to a feedback coil 5 through a feedback circuit in which a feedback resistor $R_{f1}$ is inserted.

A feedback current supplied to the feedback coil 5 is in a direction to cancel the magnetic flux $\Phi_e$ input from the pickup coil 8, and the number is counted by the up-down counter 4 until the magnetic flux $\Phi_e$ that is input becomes substantially the same as the magnetic flux $\Phi_f$ that is fed back and until no output is produced from the SQUID 1; i.e., the external magnetic flux is measured based on the feedback amount.

In the present invention, the trapping is compensated by, first, detecting the offset amount caused by the magnetic flux $\Phi_t$ trapped by the SQUID 1 based on the operation of a large feedback amount, and applying it to the trap compensation circuit 6. In the embodiment shown in FIG. 10, provision is made of a feedback system consisting of a register 16, a D/A converter 13' and a feedback resistor $R_{f2}$, in order to supply a feedback current greater than an ordinary value to the feedback coil 5, and the switch 7 is changed over in response to an instruction from the compensation control circuit 17 to select either one or both of them. the switches 7 and 7'. The compensation control circuit 17 includes, for example, a microcomputer and an I/O port. An I/O port is assigned by an address of the microcomputer. If the microcomputer writes data to the address, output data is provided by the I/O port. In fact, data is obtained by software from a console. Thus, a clock signal to a register, a control signal to a switch 7 and a control signal to a switch 7' are provided. The double-feedback system is provided to alleviate the situation where the dynamic range becomes narrow for the external magnetic flux $\Phi_e$ when the ordinary feedback system is used for detecting and compensating the trapped flux $\Phi_t$ and to alleviate the inoperative condition that happens when the trapped magnetic flux $\Phi_t$ is so great that a feedback current is not supplied to the feedback coil 5 in amounts sufficient to cancel the trapped flux $\Phi_t$. In the embodiment shown in FIG. 10 which uses the D/A converter 13' having the same dynamic range as that of the D/A converter 13 used in the ordinary feedback system, the resistance of the feedback resistor $R_{f2}$ is set to be smaller than that of the resistor $R_{f1}$ to obtain an increased amount of feedback per pulse.

According to this embodiment, therefore, the switch 7 is opened to detect the trapped flux $\Phi_t$ that interlinks the SQUID 1, and the switch 7' is closed to carry out the feedback operation through the feedback resistor $R_{f2}$. In this case, since the resistance of the feedback resistor $R_{f2}$ is smaller than that of $R_{f1}$, an increased amount of feedback is obtained per pulse. The magnetic flux detected through this operation largely stems from the trapped flux $\Phi_t$ and, hence, the value counted by the up-down counter 4 is received as the trapped flux $\Phi_t$ by the register 16. Next, when the switch 7 is closed, the trap compensation is carried out by the D/A converter 13' and the feedback resistor $R_{f2}$ and, at the same time, the operation of a small feedback amount, i.e., measurement of the external magnetic flux $\Phi_e$, is carried out by the D/A converter 13 and the feedback resistor $R_{f1}$.

Though FIG. 10 has illustrated the case where two feedback resistors $R_{f1}$, $R_{f2}$ were selected to control the amount of feedback, it is also allowable to provide many feedback resistors, or to make the feedback resistor $R_{f1}$ variable, or to make the full-range of the feedback circuit variable.

In order to compensate the trapped flux $\Phi_t$, furthermore, it is also allowable to provide many kinds of feedback coils 5 in order to adjust the magnetic flux fed back to the SQUID 1 using the same feedback current, in addition to controlling the feedback current fed to the feedback coil 5.

Figure 11:
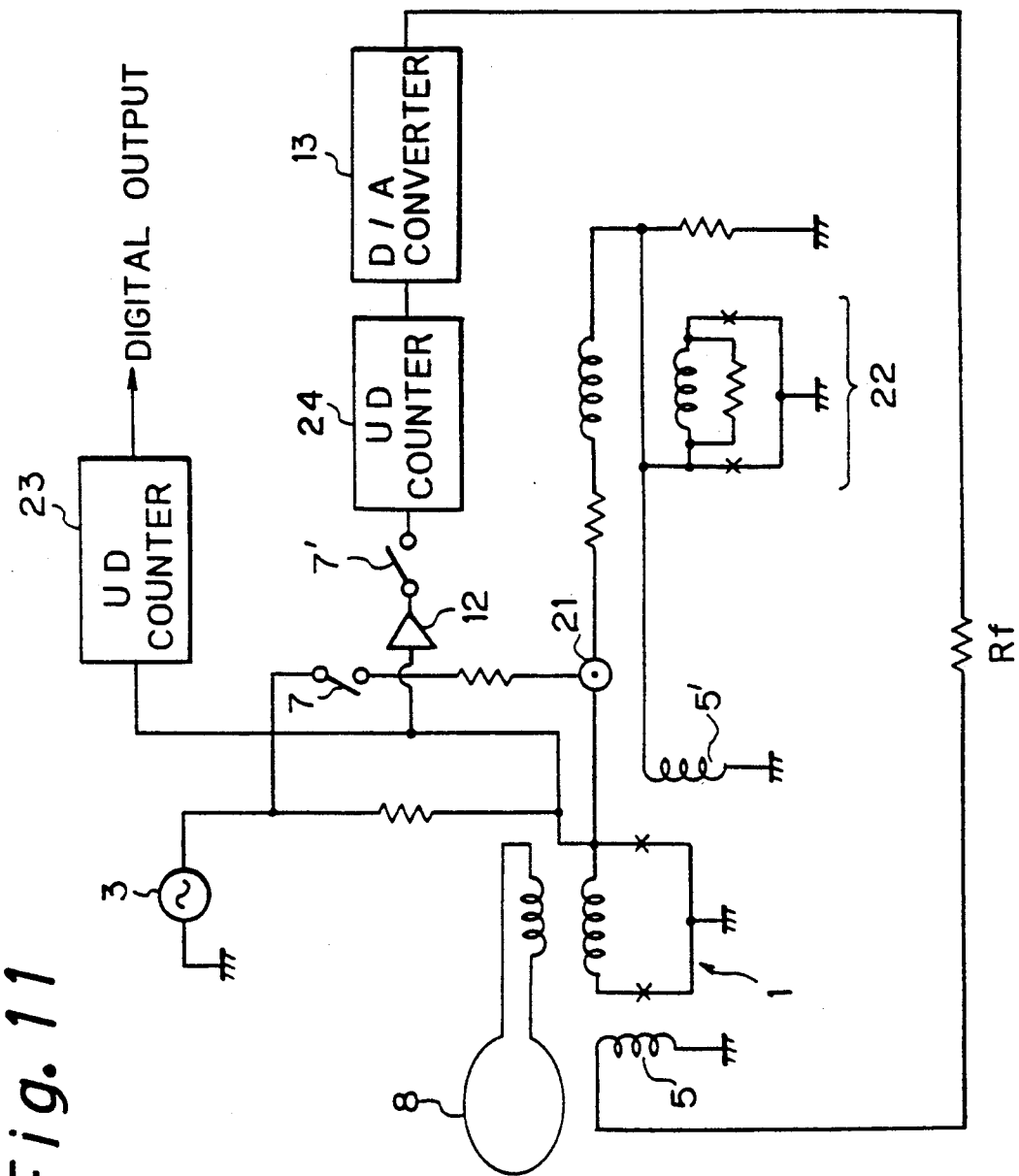
FIGS. 11 and 12 are circuit diagrams showing other embodiments of the present invention.

FIG. 11 illustrates another embodiment of the case when the present invention is adapted to a one-chip SQUID, wherein reference numeral 21 denotes an AND gate constituted by a Josephson circuit that performs an AND operation or a pulse output from the SQUID 1 and a bias pulse. When the switch 7 is opened, the output pulse of the SQUID 1 is not input to a write gate 22. On the other hand, when the switch 7 is closed, the output pulse of the SQUID 1 is input to the write gate 22.

The write gate 22 provides a positive flux quantum onto the feedback coil (superconducting storage loop) 5' when the output pulse of SQUID 1 has a positive sign and provides a negative flux quantum thereon when the output pulse has a negative sign. Further, the output of the SQUID 1 is fed to the up-down counter 23 to determine the magnetic flux input to the pickup coil on the room temperature side.

In the fluxmeter of this embodiment constituted as described above, the switch 7 is first opened so as not to operate the feedback loop which consists of a write gate 22 and a feedback coil 5'. In this case, the switch 7' is kept closed to operate the feedback loop consisting of the up-down counter 4 and the D/A converter 13 having a large feedback amount per pulse, thereby to detect the magnetic flux that is trapped, and to feed it back.

Figure 12:
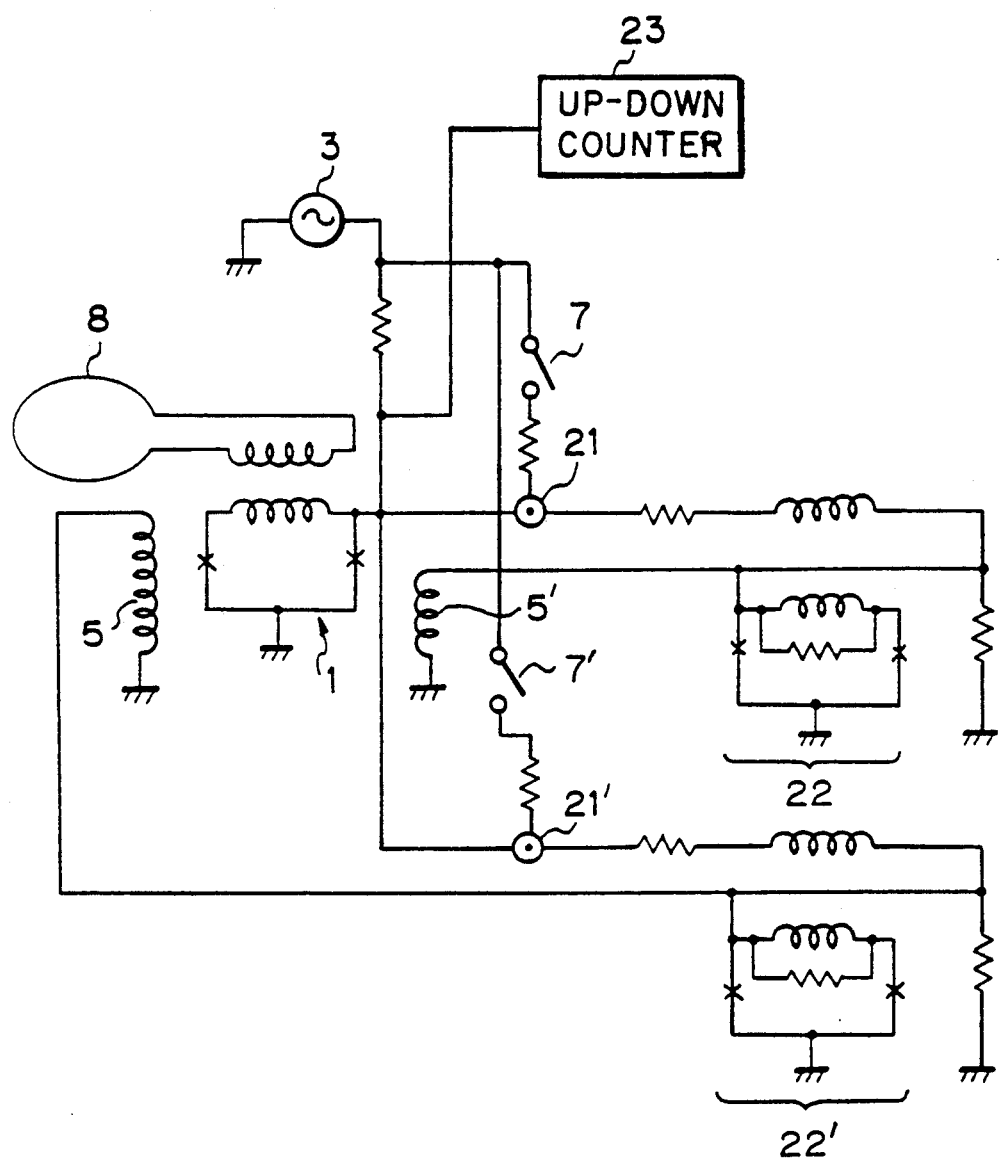

Then, the switch 7' is opened and the switch 7 is closed to operate the feedback loop consisting of the write gate 22 and the feedback coil 5' having a small feedback amount per pulse; i.e., the operation is carried out while eliminating the effect of the trapping and effectively utilizing the dynamic range. In this case as shown in FIG. 12, the feedback loop consisting of the up-down counter 4 and the D/A converter 13 may be replaced by a loop that consists of a write gate 22' and the feedback coil 5 having a large feedback amount per pulse.

According to the fluxmeter of the present invention as will be obvious from the foregoing description, the magnetic flux that is trapped can be reliably compensated without decreasing the dynamic range. Therefore, the magnetic flux can be measured while maintaining a maximum dynamic range at all times, and reliability in operation can also be improved.

We claim:

1. A digital SQUID fluxmeter for detecting an external magnetic flux, comprising:
   a flux sensor unit which detects external magnetic flux to be measured using SQUID ring and outputs pulse signals of corresponding directions and numbers;
   a counter unit coupled to said flux sensor unit, which counts the number of pulse signals including an offset quantity output by said flux sensor unit inclusive of the directions thereof, in order to measure the external magnetic flux based on the counter result of said counter unit;
   an offset quantity detection unit coupled to said counter unit, which detects the offset quantity of said counter unit generated by the magnetic flux trapped by the SQUID ring to generate a detected offset quantity; and
   a feedback unit coupled to said offset quantity detection unit and said flux sensor unit, that feeds back to said flux sensor unit a first signal responsive to the detected offset quantity and the counted result of said counter unit.

2. A digital SQUID fluxmeter according to claim 1, wherein said feedback unit is provided with a current adder that adds the detected offset quantity to the counted result of said counter unit.

3. A digital SQUID fluxmeter according to claim 1, wherein the first signal includes a second signal corresponding to the detected offset quantity and a third signal responsive to the counted result of said counter unit, and
   wherein the second and third signals are fed back separately to said flux sensor unit.

4. A digital SQUID fluxmeter according to claim 1, wherein the offset quantity detection unit is provided with a low-pass filter for removing a component of the external magnetic flux that undergoes a change with a lapse of time.

5. A digital SQUID fluxmeter according to claim 1, further comprising:
   a magnetic shielding member being arranged so that said flux sensor unit is shielded from undesired magnetic flux.

6. A digital SQUID fluxmeter for detecting an external magnetic field, comprising:
   a flux sensor unit including a SQUID ring that utilizes the Josephson effect to generate pulse signals;
   a pickup coil that detects external magnetic flux;
   a flux transformer coupled between said flux sensor unit and said pickup coil, that transfers an effect of an external magnetic field and the like detected by the pickup coil to the SQUID ring;
   an AC oscillator coupled to said flux sensor unit, that generates bias signals for the SQUID ring;
   a feedback coil coupled to the flux transformer, which feeds back an analog quantity to the flux transformer;
   a counter unit coupled to said flux sensor unit, including
      a pre-amplifier for amplifying pulse signals while maintaining a predetermined S/N ration, and
      an up-down counter for counting the pulse signals to generate an output;
   an offset quantity detection unit coupled to said counter unit, including
      an offset voltage control circuit for outputting a signal that corresponds to an offset quantity obtained based on the counted value of said up-down counter, and an offset voltage generator that converts said signals into a signal of a corresponding voltage level; and a feedback unit coupled to said counter unit, including
   a D/A converter coupled to said counter unit, that converts the output of the counter unit into an analog quantity of a corresponding level, and
   a feedback resistor coupled to said D/A converter, that converts said analog quantity into an electric current.

7. A digital SQUID fluxmeter for measuring an external magnetic flux, comprising:

a magnetic flux sensor which has a superconducting quantum interference element for outputting a number of output pulses responsive to at least one of the external magnetic flux and a trapped magnetic flux;

an AC current source coupled to said magnetic flux sensor, that applies an AC bias to said superconducting quantum interference element;

a feedback circuit coupled to said magnetic flux sensor, and including at least one feedback coil that feeds an amount of magnetic flux proportional to the number of output pulses from said superconducting quantum interference element back to said super conducting quantum interference element;

a trap compensation circuit coupled to said feedback circuit, that detects an offset amount generated by the trapped magnetic flux detected by supplying a feedback current which is at least greater than a predetermined value and which generates an offset current which is supplied to the at least one feedback coil.

8. A fluxmeter using a super conducting quantum interference element according to claim 7,
   wherein said feedback circuit includes a plurality of feedback resistors having dissimilar resistances, and
   wherein said feedback resistors are selected by switches to set a feedback current at a time when the trapped magnetic flux is detected and measured.

9. A fluxmeter using a superconducting quantum interference element according to claim 7,
   wherein a feedback resistor is included in said feedback circuit, the feedback resistor including a variable resistor, and
   a resistance of said variable resistor being changed by at least one of the switches in order to set the feedback current at a time when the trapped magnetic flux is detected and measured.

10. A fluxmeter using a superconducting quantum interference element according to claim 7, wherein the full range of the feedback circuit is made variable and is varied in order to set the feedback current at a time when the trapped magnetic flux is detected and measured.

11. A digital SQUID fluxmeter according to claim 7, wherein the at least one feed back coil includes a plurality of feedback coils coupled to the trap compensation circuit and to the feedback circuit.

12. A digital superconducting quantum interference element fluxmeter for detecting an external magnetic flux, comprising:

flux detection means including a superconducting quantum interference element, for receiving the external magnetic flux and for generating a first pulse signal based on the external magnetic flux;

counter means for counting a number of pulses occurring in the first pulse signal; and feedback means for selectively feeding back to said flux detection means at least one of a first feedback signal and a second feedback signal, based on the number of pulses counted by said counter means.

13. A method for detecting an external magnetic flux using a superconducting quantum interference element, comprising the steps of:

a) generating a number of pulses in response to the external magnetic flux by using the superconducting quantum interference element;

b) counting the number of pulses to generate a counted pulse signal;

c) determining whether a trapped magnetic flux exists in said superconducting quantum interference element based on the counted pulse signal; and d) selecting between a first feedback circuit for supplying a first feedback flux to said superconducting quantum interference element and a second feedback circuit for supplying a second feedback flux to said superconducting quantum interference element, based on said step c.

14. A digital superconducting quantum interference element fluxmeter for detecting an external magnetic flux, comprising:

flux detection means including a superconducting quantum interference element, for receiving the external magnetic flux and for generating a first pulse signal based on the external magnetic flux;

counter means for counting a number of pulses occurring in the first pulse signal; and feedback means including first and second feedback paths for selectively feeding back to said flux detection means at least one of a first feedback signal on the first feedback path and a second feedback signal on the second feedback path, based on the number of pulses counted by said counter means.

15. A method for detecting an external magnetic flux using a superconducting quantum interference element, comprising the steps of:

a) generating a number of pulses in response to the external magnetic flux by using the superconducting quantum interference element;

b) counting the number of pulses to generate a counted pulse signal;

c) determining whether a trapped magnetic flux exists in said superconducting quantum interference element based on the counted pulse signal; and d) selecting between a first feedback circuit for supplying a first feedback flux to said superconducting quantum interference element and a second feedback circuit for supplying a second feedback flux to said superconducting quantum interference element, based on said step (c), said first and second feedback circuits separately supplying the first and second feedback fluxes, respectively, to the superconducting quantum interference element.

* * * * *

UNITED STATES PATENT AND TRADEMARK OFFICE
CERTIFICATE OF CORRECTION

PATENT NO. : 5,287,058

DATED : February 15, 1994

INVENTOR(S) : Takao GOTO et al.

It is certified that error appears in the above-identified patent and that said Letters Patent is hereby corrected as shown below:

Column 1, line 19, change "t" to --to--.

Column 2, line 11, after "(" insert --D.--.

Column 5, line 13, delete "or ("feedback circuit")", and change "feedback unit" to --feedback unit or ("feedback circuit")--;

lines 29 and 30, delete ", both figures being based on the same principle of Fig. 3.".

Column 6, line 24, change "Hertz" to --Hz--;

line 25, change "d.c." to --DC--;

line 26, change "filter." to --filter--;

line 58, change "produced" to --produces--.

UNITED STATES PATENT AND TRADEMARK OFFICE
CERTIFICATE OF CORRECTION

PATENT NO. : 5,287,058
DATED : February 15, 1994
INVENTOR(S) : Takao GOTO et al.

It is certified that error appears in the above-indentified patent and that said Letters Patent is hereby corrected as shown below:

Column 7, line 9, change "$2\alpha$" to --$2\beta$--.

Column 10, line 39, after "of" delete --them.--.

Column 12, line 2, change "SQUID" to --a SQUID--;

line 60, change "ration" to --ratio--.

Signed and Sealed this

Sixth Day of September, 1994

Attest:

BRUCE LEHMAN

Attesting Officer　　　　Commissioner of Patents and Trademarks